United States Patent [19]

Bartlett et al.

[11] Patent Number: 4,979,862

[45] Date of Patent: Dec. 25, 1990

[54] AUTOMATIC LOADING MECHANISM

[75] Inventors: Richard A. Bartlett, Conklin; Dominic A. Casale, Johnson City; John J. Konrad, Endicott; James M. Larnerd, Port Crane; Donald R. Olson; Charles R. Pigos, Jr., both of Endicott, all of N.Y.

[73] Assignee: IBM, Armonk, N.Y.

[21] Appl. No.: 289,278

[22] Filed: Dec. 23, 1988

[51] Int. Cl.⁵ .............................................. B65G 1/00
[52] U.S. Cl. .................................. 414/331; 414/567; 271/184; 271/185
[58] Field of Search ....................... 414/283, 331, 567; 198/409; 271/184, 185, 225

[56] References Cited

U.S. PATENT DOCUMENTS

| | | | |
|---|---|---|---|
| 1,462,468 | 7/1923 | Schaller | 414/419 |
| 1,476,050 | 12/1923 | Buttress | 414/560 |
| 3,055,518 | 9/1962 | Pearne et al. | 414/331 |
| 3,075,656 | 1/1963 | Pearne | 414/331 |
| 3,101,852 | 8/1963 | Pearne | 414/331 |
| 3,937,333 | 2/1976 | Tucker et al. | 214/1 |
| 4,274,792 | 6/1981 | Roth et al. | 414/564 |
| 4,425,073 | 1/1984 | Mattsson | 414/730 |
| 4,806,059 | 2/1989 | Gossl et al. | 414/331 |

FOREIGN PATENT DOCUMENTS

| | | |
|---|---|---|
| 699582 | 11/1979 | U.S.S.R. |
| 0745801 | 7/1980 | U.S.S.R. |
| 745801 | 8/1980 | U.S.S.R. |
| 905299 | 2/1982 | U.S.S.R. |
| 1009585 | 4/1983 | U.S.S.R. |
| 1175671 | 8/1985 | U.S.S.R. |
| 1242544 | 7/1986 | U.S.S.R. |

Primary Examiner—H. Grant Skaggs
Assistant Examiner—James R. Bidwell
Attorney, Agent, or Firm—Malin, Haley, McHale, DiMaggio & Crosby

[57] ABSTRACT

An automatic loading mechanism for use in the manufacture of thin, metallic circuit board panels. The invention includes a lower drum unit which accepts the metallic panels from a conveyor system. The lower drum unit is rotatably mounted within a frame assembly, and includes a plurality of clamps which can automatically receive several metallic panels of varying size. The lower unit includes automatic clamp control means, and has the capability of rotating the panels from a horizontal to a vertical position or vice-versa. The lower drum unit guidingly feeds the metallic panels, through a spline assembly, to an upper unit. The uppper unit includes a plurality of clamps, in diametrically placed pairs, which delicately handle only the peripheral edge of the metallic panels while feeding them automatically into a rack assembly.

17 Claims, 7 Drawing Sheets

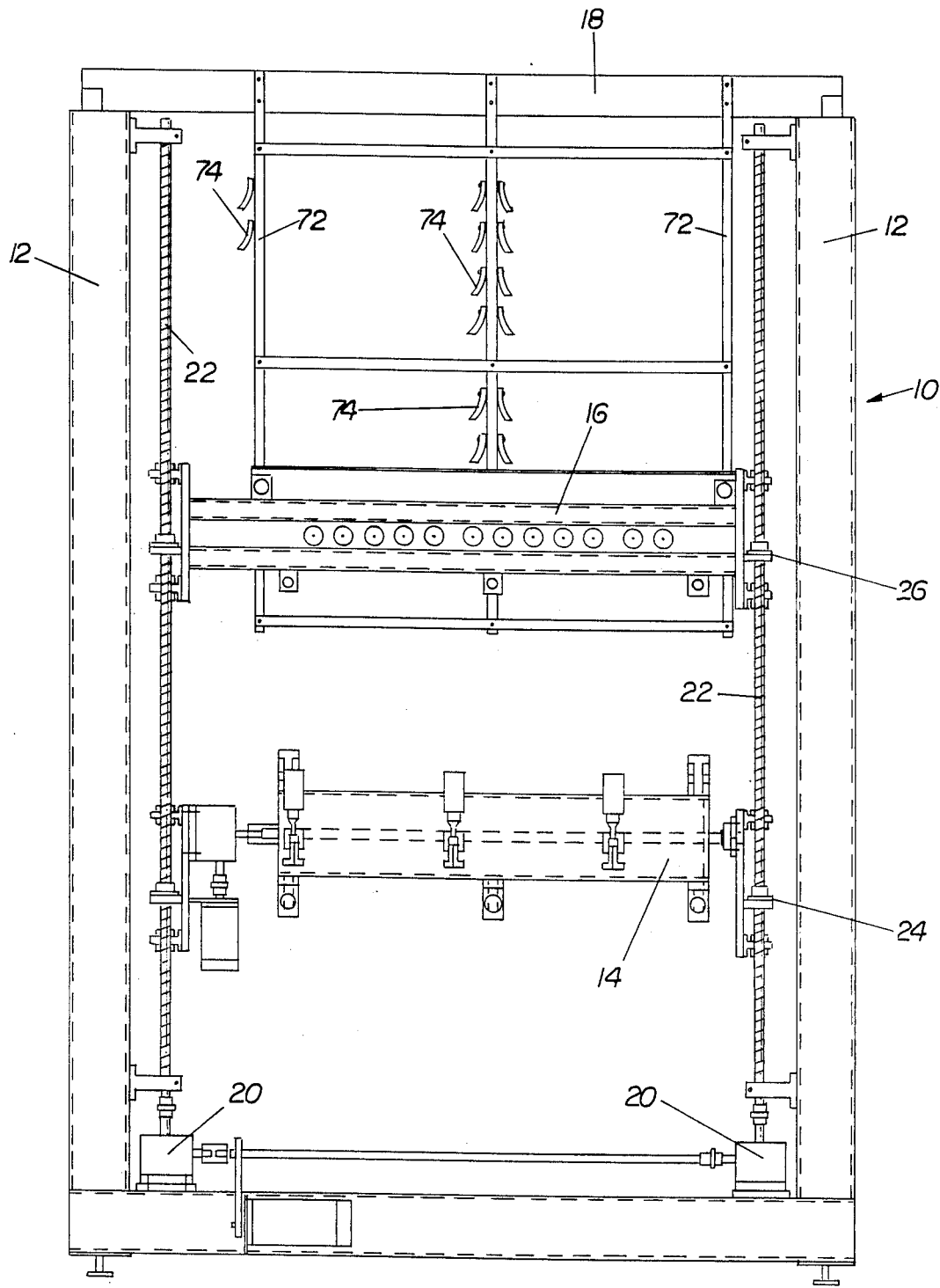
FIG. IA

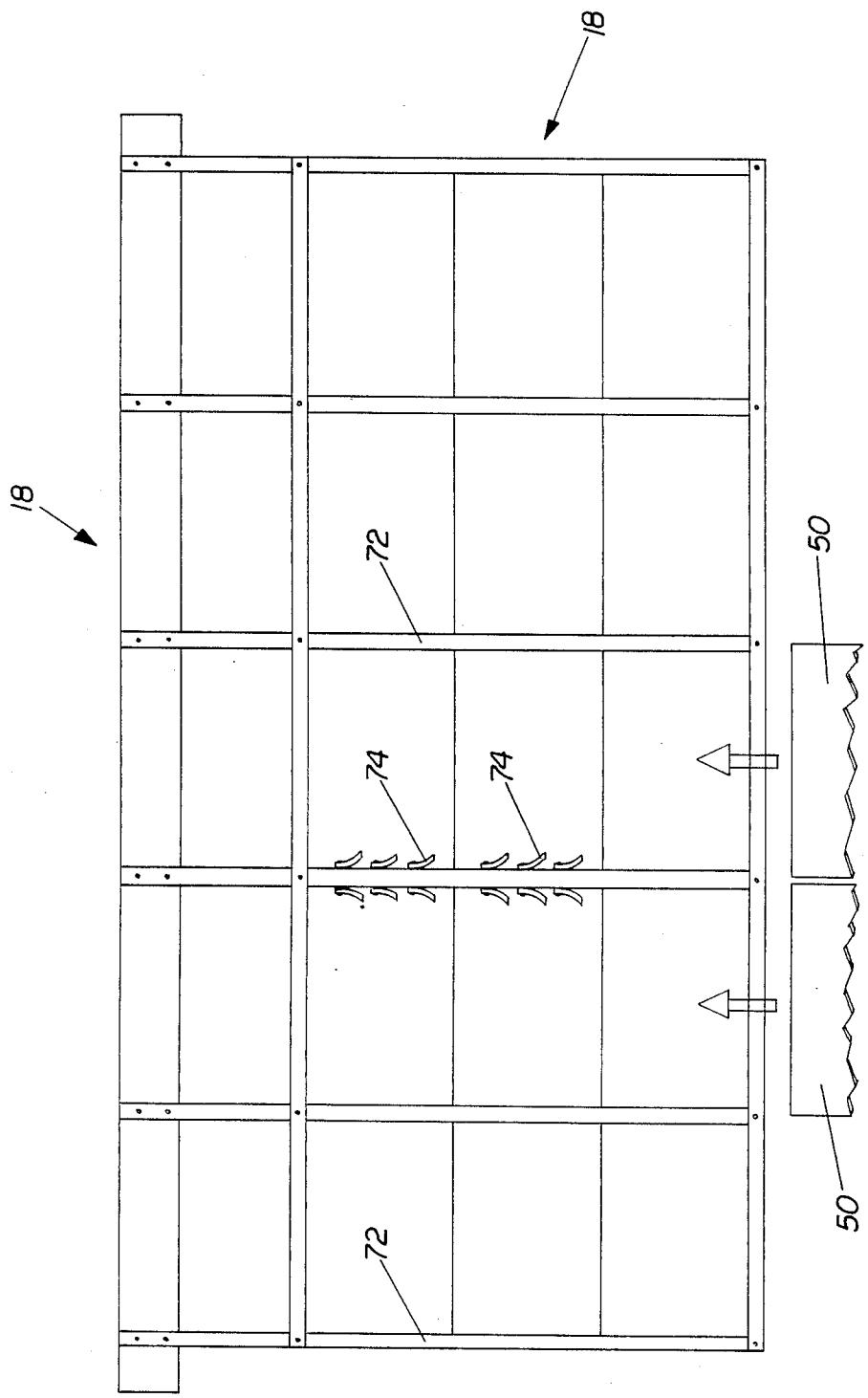

AUTOMATIC LOADING MECHANISM

BACKGROUND OF THE INVENTION

The subject matter of this invention relates to an automatic loading mechanism, and more particularly to an acid plater automatic loading or unloading mechanism which is utilized in the manufacture of printed circuit board panels.

In the manufacture of printed circuit boards and specifically in the copper plating process typically used therein, it is necessary to manipulate and transport thin metallic panels into and out of an acid plating chamber or acid bath. In attempting to automate this process, several problems must be overcome. These include the handling of panels of varying size, employing an automatic feed mechanism, employing an automatic loading mechanism, and efficiently processing numerous panels without damaging the delicate plates.

Artisans have developed several devices which attempt to overcome similar problems. U.S. Pat. No. 4,274,792 discloses an apparatus for automatically unfastening glass sheets from gripping machines; U.S. Pat. No. 4,425,073 discloses a pivotally supported gripping mechanism utilizing hydraulics; U.S. Pat. No. 1,462,468 discloses an automatic tray turning mechanism; U.S. Pat. No. 1,476,050 discloses a mechanism for handling formed sections of plasterboard; U.S. Pat. No. 3,937,333 discloses a mechanism for automatically laying down structural members; and U.S.S.R. Patent No. 745,801 discloses a mechanism for reorientating glass sheets using hydraulic actuator means. However, these prior devices do not overcome the problems of automatically handling a plurality of target panels wherein the panels vary in dimension and they do not overcome the problem of contacting only the extreme periphery of the thin metallic panels to prevent damage in the handling process. Similarly, it is necessary to solve the problem of avoiding any direct contact on the primary surface of the metallic panels, thus preventing a clamping or contact force which would cause damage to circuit lines. Finally, special problems exist in a manufacturing process which requires reorientating a plurality of panels, automatically, wherein the panels have varying size. These problems are not addressed by the prior art.

It is therefore highly desirable to provide an automatic loading mechanism which can automatically accommodate a plurality of metallic panels of varying size.

It is also highly desirable to provide an automatic loading mechanism which contacts only the extreme periphery of metallic panels.

It is also highly desirable to provide an automatic loading mechanism capable of precision handling of delicate, thin metallic panels.

It is also highly desirable to provide an automatic loading mechanism which can automatically process a large number of metallic panels.

It is also highly desirable to provide an automatic loading mechanism which is capable of reorientating circuit panels to interface with discrete processing units.

It is also highly desirable to provide an automatic loading mechanism which is cost effective yet operationally efficient.

Finally, it is highly desirable to provide an automatic loading mechanism having all of the above mentioned features.

OBJECTS AND SUMMARY OF THE INVENTION

It is therefore an object of the invention to provide an automatic loading mechanism which can automatically accommodate a plurality of metallic panels of varying size.

It is also an object of the invention to provide an automatic loading mechanism which contacts only the extreme periphery of metallic panels.

It is also an object of the invention to provide an automatic loading mechanism capable of precision handling of delicate, thin metallic panels.

It is also an object of the invention to provide an automatic loading mechanism which can automatically process a large number of metallic panels.

It is also an object of the invention to provide an automatic loading mechanism which is capable of reorientating circuit panels to interface with discrete processing units.

It is also an object of the invention to provide an automatic loading mechanism which is cost effective yet operationally efficient.

Finally, it is an object of the invention to provide an automatic loading mechanism having all of the above mentioned features.

Briefly, there is provided an automatic loading mechanism for use in the manufacture of thin, metallic circuit board panels. The invention includes a lower drum unit which accepts the metallic panels from a conveyor system. The lower drum unit is rotatably mounted within a frame assembly, and includes a plurality of clamp means which can automatically receive several metallic panels of varying size. The lower unit includes automatic clamp control means, and has the capability of rotating the panels from a horizontal to a vertical position or vice-versa. The lower drum unit guidingly feeds the metallic panels, through a spline assembly, to an upper unit. The upper unit includes a plurality of clamp means, in diametrically placed pairs, which delicately handle only the peripheral edge of the metallic panels while feeding them automatically into a rack assembly.

BRIEF DESCRIPTION OF THE DRAWINGS

The above mentioned and other features and objects of this invention and the manner of attaining them will become more apparent and the invention itself will be best understood by reference to the following description of an embodiment of the invention taken in conjunction with the accompanying drawings, wherein:

FIG. 1A is a front plan view illustrating an embodiment of the invention;

FIG. 4 is a front plan view illustrating an embodiment of the rack assembly of the invention;

BEST MODE FOR CARRYING OUT THE INVENTION

Figure 1B:
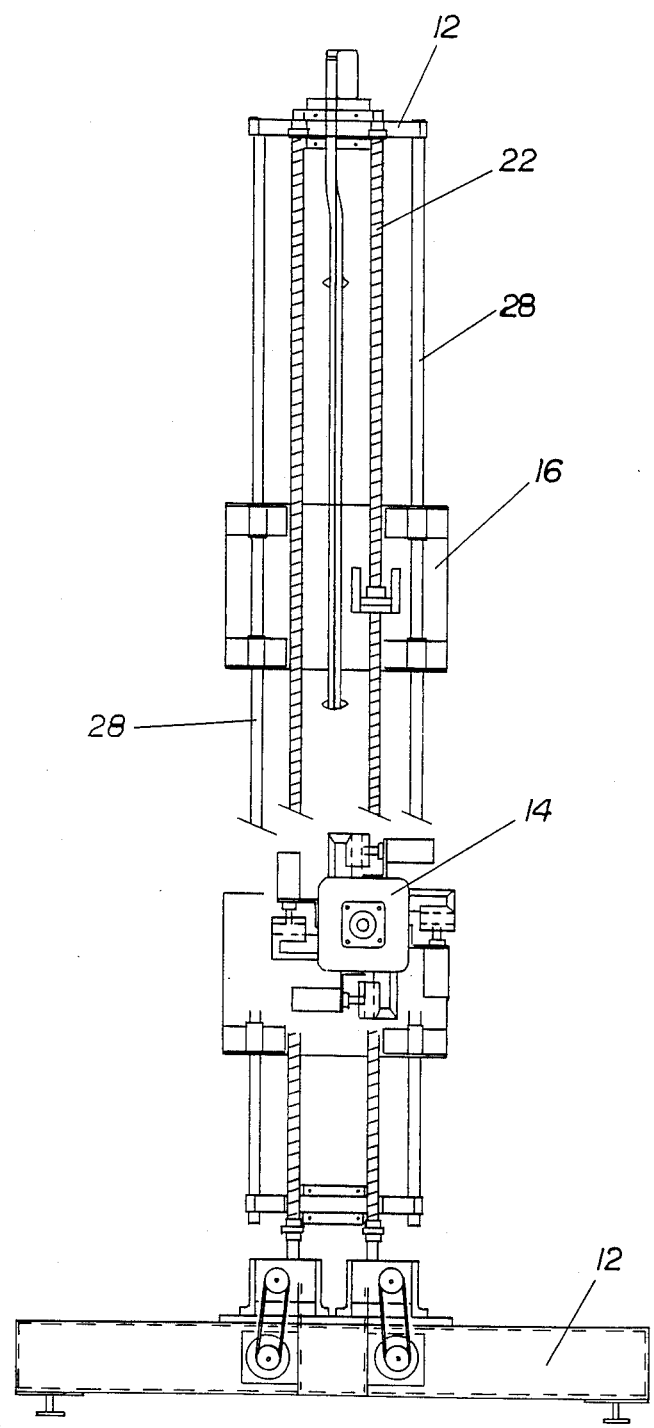
FIG. 1B is a side plan view of the embodiment of the invention as shown in FIG. 1A.

Referring now to FIG. 1A and FIG. 1B, the automatic loading mechanism 10 is shown having a frame assembly 12. Frame assembly 12 houses lower drum unit 14 and upper unit 16, as well as rack assembly 18. The frame means includes drive means 20, which in a particular embodiment can be gear assemblies which drive central lead screws 22. As shown in FIGS. 1A and 1B, lower drum unit 14 and upper unit 16 can be threadedly secured at points 24 and 26 to the central lead screws. Note that the upper unit and the lower drum unit are stabilized during movement by rod means 28, which in a particular embodiment comprise a pair of external steel rods located on opposite sides of each of the aforementioned central lead screws 22. The rod means 28 also functions to vertically align the lower drum unit 14, upper unit 16, and the frame assembly.

Figure 2A:
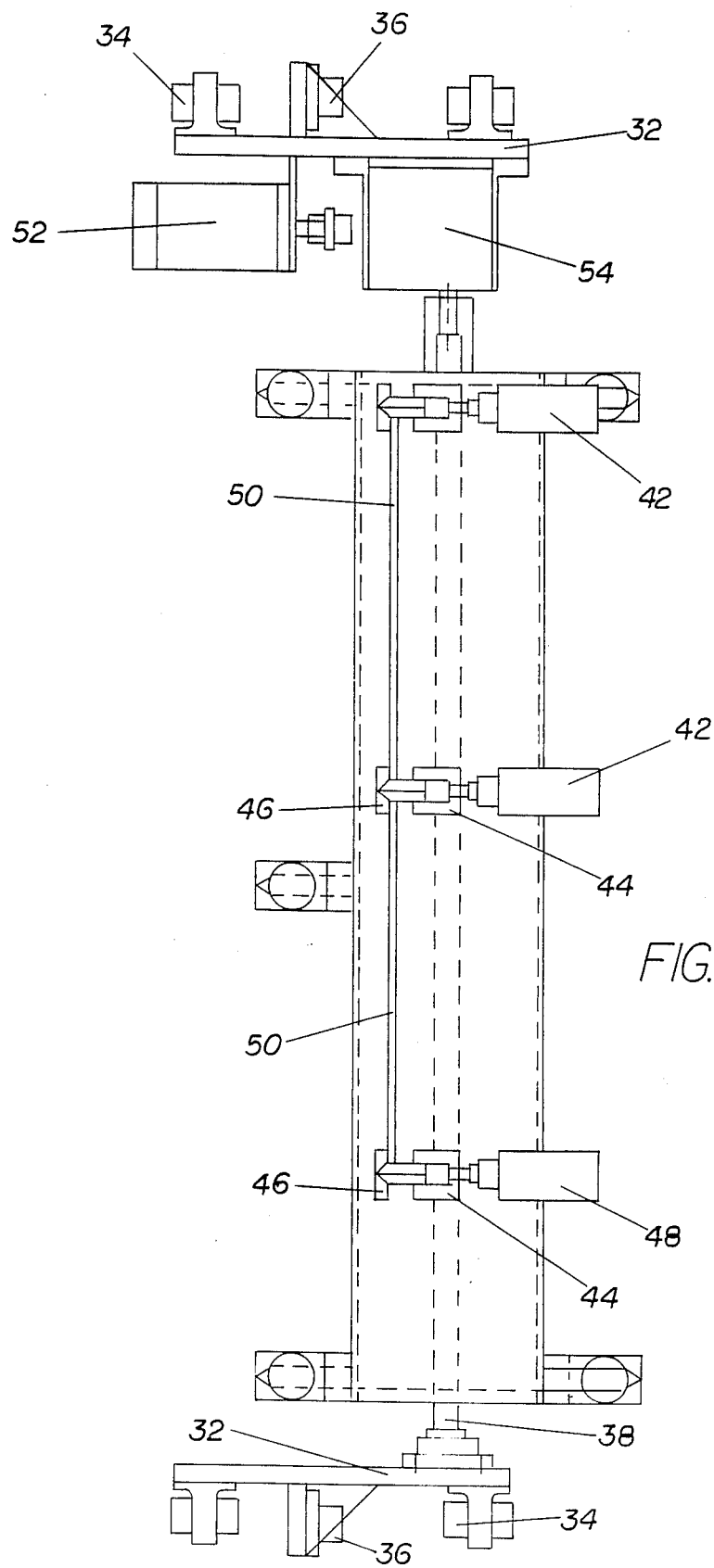
FIG. 2A is a front plan view illustrating an embodiment of the lower drum unit of the invention.
Figure 2B:
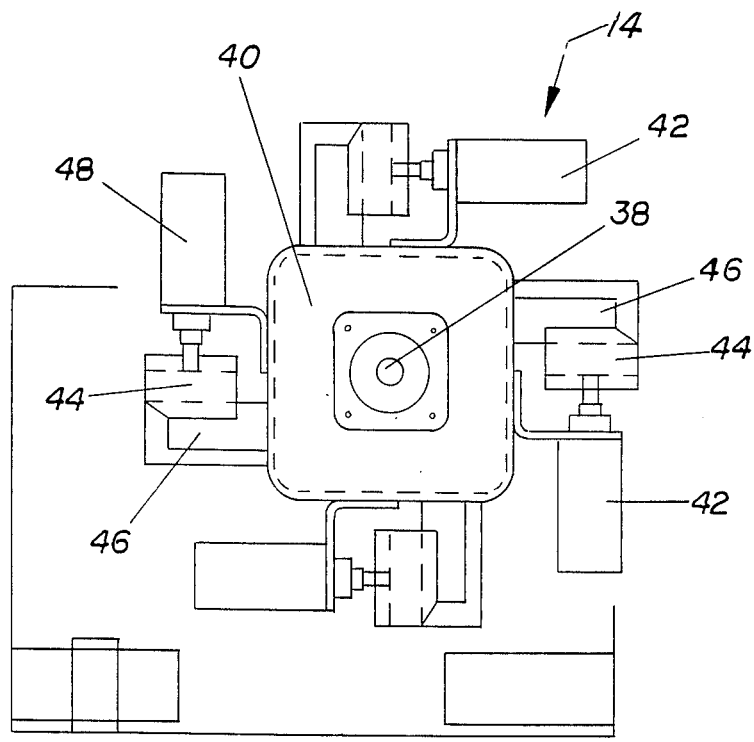
FIG. 2B is a side plan view illustrating the invention as shown in FIG. 2A.

Referring now to FIGS. 2A and 2B, the details of the drum means 14 are illustrated. Drum means 14 includes mounting means 32, ball slides 34 and nut assemblies 36, which mount the drum assembly to the central lead screws 22 and rod means 28 as illustrated in FIGS. 1A and 1B.

Drum means 30 includes rotation means 38 which allows the drum assembly to rotate as desired. In a particular embodiment the drum is generally rectangular in shape, as shown at 40 in FIG. 2B. The drum assembly 14 includes a plurality of clamp means 42. Clamp means 42 includes generally U-shaped sections 44 which slidingly engage T-section 46. Clamp control means 48 are pneumatically driven which actuate generally U-shaped section 44, while T-shaped section 46 remains fixed. In this manner, when a metallic panel 50 is fed into a given pair of clamp means 42, the actuation means 48 drives generally U-shaped section 44 towards T-shaped section 46 until the metallic panel is encountered and thereafter held in position.

As is readily observed, any given number of clamp means 42 can be utilized on a particular surface of the drum, in order to accommodate metallic panels of varying size. Similarly, the spaced relationship between any two or more clamp means on any given surface of drum means 14 can vary in number, such that the lower drum unit can automatically receive metallic panels of differing sizes. Drum rotation drive train 52 interacts, in one embodiment, through gear assembly 54 in order to impart rotation to the drum assembly. This process will further be described in detail hereinafter, in conjunction with the overall process.

As will be readily appreciated by one of ordinary skill in the art, the clamp control means could entail a variety of technologies, including hydraulic, electronic, and/or mechanical structure. Likewise, the clamp means of the instant invention could incorporate a variety of gripping or handling devices which would similarly secure the metallic panels to the drum unit.

Figure 3B:
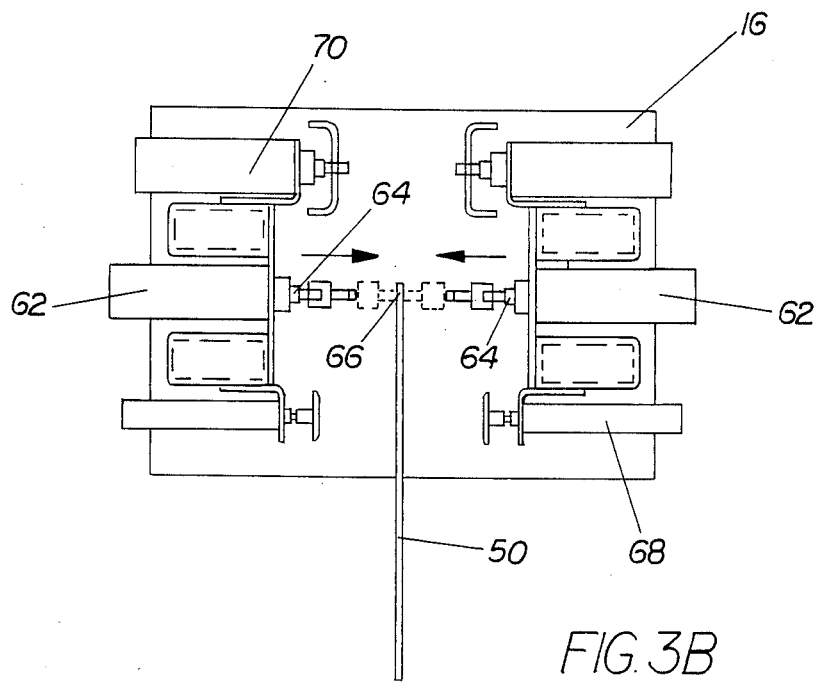
FIG. 3B is a side plan view illustrating the invention as shown in FIG. 3A.
Figure 3A:
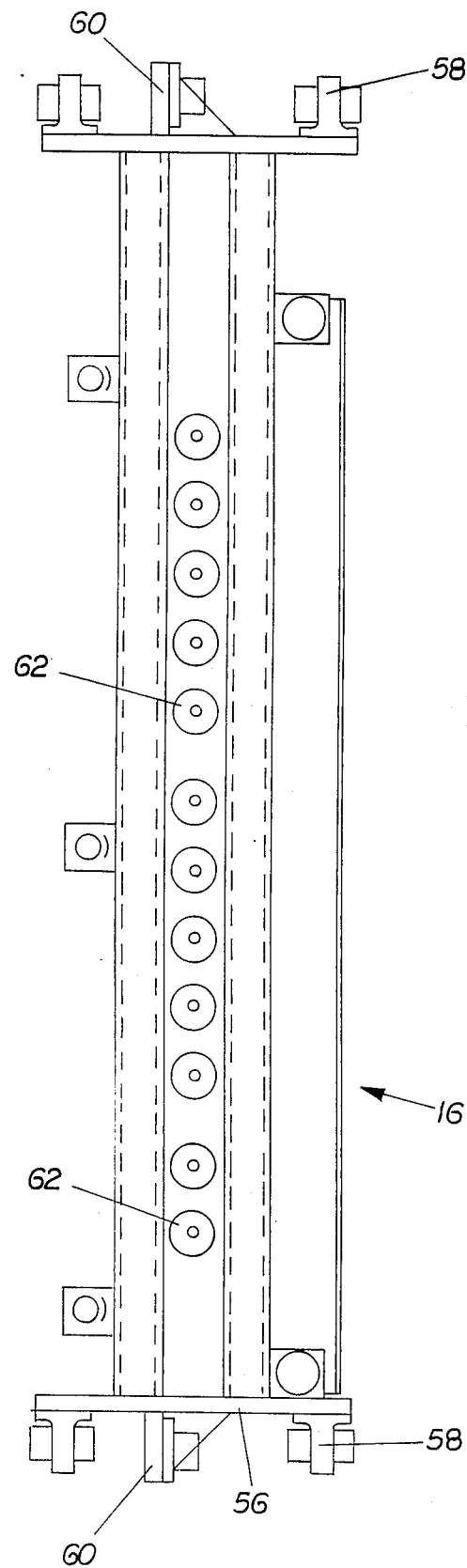
FIG. 3A is a front plan view illustrating an embodiment of the upper unit of the invention.

Referring now to FIGS. 3A and 3B, the details of the upper unit ar illustrated.

Upper unit 16 includes mounting means 56, having slide mechanisms 58 and nut assemblies 60. These mechanisms mount the upper unit to the frame assembly 12 utilizing the central lead screws 22 and rod means 28 as illustrated in FIGS. 1A and 1B.

Upper unit 16 also includes a plurality of clamp means 62 which are utilized in handling the extreme periphery of the metallic panels. Clamp means 62 comprise discrete pairs of diametrically positioned air cylinders. Each air cylinder would include an actuation mechanism 64 which would extend outwardly to contact a metallic panel 50, as illustrated in FIG. 3B. Note that at point 66, an individual pair of air cylinders would clamp panel 50 at a precisely opposing point.

As shown in FIG. 3B, upper unit 16 also includes a plurality of panel guide means 68 and rack clamp means 70. Rack clamp means and panel guide means are also discrete pairs of diametrically placed clamps. The panel guide means functions, as further described in detail hereinafter, to guidingly engage a metallic panel until clamp means 62 can supersede the process and stabilize the panel.

Rack clamp means 70 functions so as to hold the rack assembly 18 in position within a transporter to which functions to further transport the rack assembly 18.

Referring now to FIGS. 1 and 4, the details of the rack assembly 18 are illustrated. Rack assembly 18 includes a plurality of spline members 72 which guidingly receive metallic panels 50. Each spline 72 can house a plurality of spring clips 74 which would, through tension, securely position the metallic panels. In the embodiment illustrated in FIG. 4, the rack assembly would house fifteen (15) separate metallic panels 50, in a fully loaded status. As will be fully appreciated by those of ordinary skill in the art, the capacity of each row of the rack assembly 18 will correspond to the capacity of the lower unit 14 and upper unit 16 in the total number, and size, of metallic panels that the mechanism can facilitate.

Figure 5:
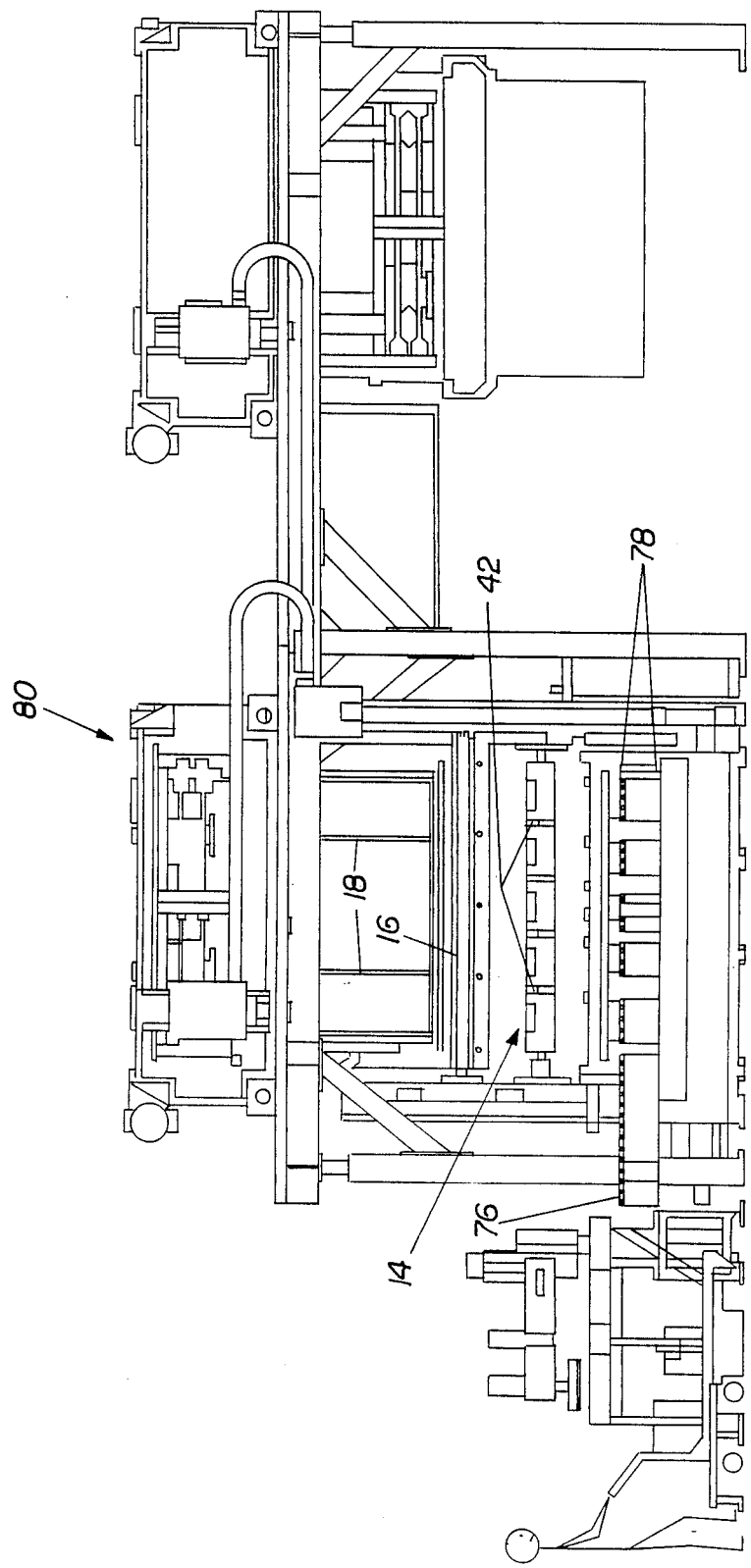
FIG. 5 is a front plan view generally illustrating the overall environment of the invention.

Referring now to FIG. 5, the overall operation of the system will be described. Conveyor means 76 feeds a plurality of metallic panels 50 towards the automated loading mechanism. Any conventional conveying system can be utilized with the instant invention. The metallic panels 50 are fed along the conveyor to predetermined stop points 78 which align the various panels, initially, for input to the lower drum unit 14. At the point of input, the panels are fed from the conveyor 76 to the lower drum unit 14. As illustrated in FIG. 5, the drum unit in this embodiment contains six clamp means 42, allowing the drum unit to accommodate five separate metallic panels simultaneously. The five panels are positioned within the clamp means 42, and at this point the panels would be horizontally positioned. The lower drum unit 14 then rotates the panels, about its axis through rotation means 38, from a horizontal to a vertical position for placement into the upper unit 16. Once the panels are vertically positioned, the lower unit 14 is driven upwardly, utilizing the central lead screws 22 and drive assemblies 20, toward the upper unit 16. The panels 50 would initially encounter rack assembly 18, at the latter's lowermost point. Once the panels are placed a relatively short length within the rack assembly, they then encounter upper unit 16. In this embodiment the upper unit 16 is maintained in a position slightly above the lowermost point of rack assembly 18. In alternative embodiments the upper unit 16 could pass below the rack assembly, if such an operation were desired. As illustrated in FIG. 3B, the panel guide means 68 guidingly engage the panel means 50 to a point wherein clamp means 62 can supersede and maintain the panels 50 firmly in position. As illustrated in FIG. 3A, a plurality of clamp means 62 will engage the panel 50. It is significant to note that the clamp means 62 only contacts the extreme outer periphery of a given metallic panel 50, to allow for delicate handling of the panel, and to avoid damage thereto. For example, the metallic panels can vary in thickness from 0.040 inch to about 0.250 inch, and are extremely flexible. In this manner, the mechanism avoids any handling of the panel at vulnerable locations.

Once the upper unit clamp means has engaged the metallic panels, the upper unit is then driven further upwardly such that the panels are moved to the uppermost available point within the rack assembly 18. As illustrated in FIGS. 4 and 5, five metallic panels would be simultaneously positioned within the rack assembly 18. The operation would then be continued until three separate rows of metallic panels have been placed within the splines of the rack assembly 18, such that, in this embodiment, a total of fifteen (15) metallic panels would be positioned within the rack assembly. The splines slidingly engage the metallic panels. Both the lower unit 14, the upper unit 16, and the rack assembly 18, only engage the metallic panels at their outermost peripheries as discussed above.

After the upper unit 16 has engaged the panels, the lower drum unit 14 is released and lowered, wherein it is repositioned to receive additional metallic panels from the conveyor means 76. Similarly, once the upper unit has placed the panels within the rack assembly at the uppermost position, the clamp means 62 are released and the upper unit is lowered such that it can receive, in sequence, the next set of panels from the lower unit 14.

With the rack assembly 18 fully loaded, a transporter mechanism 80 takes over in order to transport the rack assembly 18 to the acid plating chamber or acid bath. Conventional transporter means 80 can be utilized with the instant invention, which would include overhead cranes, automated conveyor systems, etc.

Once the rack assembly has been treated in the plating chamber, the rack assembly is returned to the instant invention and specifically positioned within frame means 12. At this point in the process, the reverse steps would take place, which would entail the upper unit unloading the rack assembly, and delivering the metallic panels 50 to the lower unit, the lower unit then rotating the metallic panels 50 from a vertical to a horizontal position, and delivering the same to the conveyor system. In this manner, an entire receipt and delivery system is provided.

It should be noted that only one drive mechanism is utilized to drive the lower drum unit 14 upwardly within frame means 12. This is accomplished through a common drive shaft connected to the opposed, central screw means 22 as illustrated in FIGS. 1A and 1B. The upper unit 16 is driven by a second drive motor along a separate pair of central lead screws 22, which allows the upper and lower units to be independently movable with respect to one another. In a particular embodiment however, the upper unit 16 and lower unit 14 are slidably stabilized about a common set of rod mean 28 to accomplish the previously described operation.

While there have been described above the principles of this invention in connection with specific apparatus, it is to be clearly understood that this description is made only by way of example and not as a limitation to the scope of the invention.

What is claimed is:

1. An automatic loading apparatus, comprising:
   frame means;
   lower unit drum means, said drum means being movably secured within said frame means;
   upper unit means, said upper unit means being movably secured within said frame means; and
   rack means, said rack means being movably secured within said frame means;
   said drum means including rotation means to rotate said drum means about its longitudinal axis, said drum means including a plurality of clamp means, said clamp means being adapted to receive a plurality of panel members; said drum means being vertically movable within said frame means;
   said upper unit means including a plurality of clamp means, said upper unit means being vertically movable within said frame means and aligned with respect to said drum means;
   said drum means receiving said panel members and reorientating said panel members from a horizontal to a vertical position, said drum means inputting said panel members into said upper unit means, said upper unit means positioning said panel members within said rack means.

2. The apparatus of claim 1, further comprising:
   stabilizing means and positioning means, said stabilizing means and positioning means being secured within said frame means, said drum means and said upper unit means being stabilized by said stabilizing means;
   said drum means and said upper unit means being movable about said positioning means.

3. The apparatus of claim 2, wherein said stabilizing means vertically aligns said drum means and said upper unit means within said frame means.

4. The apparatus of claim 1, wherein said drum means is generally rectangular in cross section having four independent surfaces, said drum means including a plurality of said clamp means on each individual surface, said clamp means being selectively positioned about said drum means to accommodate panel members of varying size, wherein by rotating said drum means, said drum means can automatically receive said panel members.

5. The apparatus of claim 4, wherein each of said clamp means comprises a pneumatically actuated clamp, said clamp having a first movable, generally U-shaped section, and a second, permanently positioned, generally T-shaped section, said U-shaped section guidingly receiving said T-shaped section and capable of grasping a panel member therebetween.

6. The apparatus of claim 5, wherein said clamp means further comprises clamp control means which pneumatically actuates said clamp means.

7. The apparatus of claim 5, wherein said clamp means further comprises clamp control means which hydraulically actuates said clamp means.

8. The apparatus of claim 2, wherein said drum means includes bearing means, wherein said drum means is rotatable about its longitudinal axis, said mounting means including slide means positionable about said frame stabilizing means, and assembly means, said assembly means threadably receiving said frame positioning means.

9. The apparatus of claim 1, wherein said plurality of upper unit clamp means includes a plurality of discrete pairs of air cylinder clamps, each said pair having diametrically positioned members, each said pair contacting said panel members at corresponding, opposite points about the outer periphery of said panel members, said plurality of clamp pairs securing said panel members.

10. The apparatus of claim 9, wherein said upper unit means further comprises panel guide means, said panel guide means initially receiving and guiding said panel members toward said clamp means; and rack clamp means, said rack clamp means maintaining said rack means in a previously selected position;
said panel guide means and said rack clamp means being aligned about said clamp means.

11. The apparatus of claim 10, wherein said upper unit means further comprises slide means, said slide means positionable about said frame stabilizing means, and thread means, said thread means threadably receiving said frame positioning means, wherein said upper unit means is vertically positionable within said frame means.

12. The apparatus of claim 1, wherein said rack means is comprised of a plurality of spline members, said spline members positioned to receive said panel members, said spline members movably securing said panel members within said rack means.

13. The apparatus of claim 12, wherein each of said spline members includes spring clip means for movably securing said panel members.

14. The apparatus of claim 1, wherein said drum means, and said upper unit means are independently movable within said frame means.

15. The apparatus of claim 1, wherein said drum means and said upper unit means are vertically positioned within said frame means and aligned therewithin such that said drum means can guidingly introduce said panel members into said upper unit clamp means.

16. An apparatus for automatically loading metallic panel members into a rack assembly, said apparatus comprising:

a frame assembly;
a lower drum unit, said lower drum unit being rotatably mounted within said frame assembly, said lower drum unit being generally rectangular in cross section and defining four independent surfaces, said lower drum unit being rotatable about its longitudinal axis, said lower drum unit including a plurality of pneumatically actuated clamps, each of said clamps including a generally U-shaped movable section and a generally T-shaped section, said U-shaped section guidingly receiving said T-shaped section, each said clamps being designed to secure the outer periphery of a panel member, each of said drum surfaces having a plurality of said clamp members selectively positioned thereabout to receive a plurality of panel members of varying sizes;
an upper unit, said upper unit being slidably positioned within said frame assembly, said upper unit including a plurality of air cylinder clamp pairs, each of said pairs being diametrically placed and aligned to receive the outer periphery of said panel members, said upper unit further including guide means, said guide means introducing said panel members to said plurality of air cylinder clamp pairs, said upper unit and said lower drum unit being vertically aligned within said frame assembly and movable therebetween; and
a rack assembly, said rack assembly being mounted within said frame assembly, said rack assembly including a plurality of splines, said splines being designed to guidingly receive a plurality of said panel members, said rack assembly also being vertically aligned within said frame assembly to guidingly interact with said upper unit;
wherein a conveyor assembly feeds a plurality of panel members which are horizontally positioned into said lower drum unit, said lower drum unit receiving a plurality of said panel members, said lower drum unit securing said panel members within said lower drum unit clamp members, said lower drum unit rotating said panel members from a horizontal to a vertical position in alignment with said upper unit, said lower drum unit upwardly moving said panel members into said rack assembly, said upper unit plurality of air cylinder clamp pairs guidingly receiving said panel members;
said lower unit then retracting while said upper unit moves further upwardly within said frame assembly and repositions said panel members within said rack assembly in a predetermined, loaded fashion, wherein said rack assembly is loaded automatically with said panel members, said automatic loading apparatus being capable of automatically handling a plurality of panel members of varying size, and repositioning said panel members from vertical or horizontal positions, such that true automation is achieved.

17. The apparatus of claim 1 wherein the drum means first inputs said panel members within the lowermost section of said rack means, said upper unit means then receiving and further positioning said panel members within said rack means.

* * * * *